US012170535B2

(12) United States Patent
Lee et al.

(10) Patent No.: US 12,170,535 B2
(45) Date of Patent: Dec. 17, 2024

(54) ELECTRONIC DEVICE AND METHOD FOR OBTAINING REVERSE SIGNAL AND FEEDBACK SIGNAL IN WIRELESS COMMUNICATION SYSTEM

(71) Applicant: Samsung Electronics Co., Ltd., Suwon-si (KR)

(72) Inventors: Munwoo Lee, Suwon-si (KR); Jungwoo Ku, Suwon-si (KR); Youngyoon Woo, Suwon-si (KR); Dogeun Eum, Suwon-si (KR); Seonghyeon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 18/188,106

(22) Filed: Mar. 22, 2023

(65) Prior Publication Data

US 2023/0387948 A1    Nov. 30, 2023

Related U.S. Application Data

(63) Continuation of application No. PCT/KR2023/003382, filed on Mar. 13, 2023.

(30) Foreign Application Priority Data

May 24, 2022  (KR) .......................... 10-2022-0063783
May 31, 2022  (KR) .......................... 10-2022-0067260

(51) Int. Cl.
   *H04B 1/04*    (2006.01)
(52) U.S. Cl.
   CPC ... *H04B 1/0475* (2013.01); *H04B 2001/0408* (2013.01)

(58) Field of Classification Search
   CPC .......... H04B 1/0475; H04B 2001/0408; H04B 17/103; H04B 2001/0425;
   (Continued)

(56) References Cited

U.S. PATENT DOCUMENTS 6,960,956 B2 * 11/2005 Pehlke .................... H03F 1/345
                                                                455/127.1
7,081,794 B2    7/2006 Burke et al.
(Continued)

FOREIGN PATENT DOCUMENTS

CN    106713195 B    5/2017
CN    110401460 A    11/2019
(Continued)

OTHER PUBLICATIONS

International Search Report and written opinion dated May 31, 2023, issued in International Application No. PCT/KR2023/003382.

*Primary Examiner* — Sophia Vlahos
(74) *Attorney, Agent, or Firm* — Jefferson IP Law, LLP

(57) ABSTRACT

An electronic device is provided. The electronic device includes a digital pre-distortion (DPD), a digital-to-analog converter (DAC), a power amplifier (PA), a first coupler obtaining a feedback signal from an output of the power amplifier, a circulator obtaining a reverse signal in which the output of the power amplifier is reflected, a transmission filter, a second coupler obtaining a filter-feedback signal from an output of the transmission filter, an antenna, an analog-to-digital converter (ADC) converting a composite signal including the feedback signal, the filter-feedback signal, and the reverse signal into a digital composite signal, a separation circuit, and a pulse inter-modulation cancellation (PIMC) circuit in which the separation circuit, based on the digital composite signal and an input signal of the DPD, (Continued)

obtains a digital signal of the feedback signal, a digital signal of the filter-feedback signal, and a digital signal of the reverse signal.

20 Claims, 10 Drawing Sheets

(58) Field of Classification Search
CPC .... H04B 2001/0433; H04B 1/123; H04B 1/525; H03F 1/3247; H03F 1/3252; H04L 25/03343; H04L 27/2614; H04L 27/368
See application file for complete search history.

(56) References Cited

U.S. PATENT DOCUMENTS

| | | | |
|---|---|---|---|
| 7,327,802 B2 * | 2/2008 | Sanders | ............ H04B 1/525 375/296 |
| 9,054,759 B2 | 6/2015 | Watanabe | |
| 9,588,158 B2 | 3/2017 | Langer et al. | |
| 9,673,861 B2 | 6/2017 | Heinikoski et al. | |
| 9,755,673 B2 | 9/2017 | Hellmann et al. | |
| 9,831,900 B2 | 11/2017 | Okawa et al. | |
| 11,329,689 B1 * | 5/2022 | Rodenbeck | ............ H04B 1/525 |
| 11,650,236 B2 | 5/2023 | Cho | |
| 2007/0026838 A1 * | 2/2007 | Staudinger | ................ H03F 3/24 455/341 |
| 2014/0210450 A1 | 7/2014 | Barabash et al. | |
| 2019/0068234 A1 | 2/2019 | Khlat et al. | |
| 2021/0074529 A1 | 3/2021 | Labanc et al. | |

FOREIGN PATENT DOCUMENTS

| | | |
|---|---|---|
| JP | 2016-213603 A | 12/2016 |
| JP | 2020-107934 A | 7/2020 |
| KR | 10-1616607 B1 | 4/2016 |
| KR | 10-2021-0031397 A | 3/2021 |
| KR | 10-2454033 B1 | 10/2022 |

* cited by examiner

ELECTRONIC DEVICE AND METHOD FOR OBTAINING REVERSE SIGNAL AND FEEDBACK SIGNAL IN WIRELESS COMMUNICATION SYSTEM

CROSS-REFERENCE TO RELATED APPLICATION(S)

This application is a continuation application, claiming priority under § 365 (c), of an International application No. PCT/KR2023/003382, filed on Mar. 13, 2023, which is based on and claims the benefit of a Korean patent application number 10-2022-0063783, filed on May 24, 2022, in the Korean Intellectual Property Office, and of a Korean patent application number 10-2022-0067260, filed on May 31, 2022, in the Korean Intellectual Property Office, the disclosure of each of which is incorporated by reference herein in its entirety.

TECHNICAL FIELD

The disclosure relates to a wireless communication system. More particularly, the disclosure relates to a circuit for obtaining a reverse signal and a feedback signal in the wireless communication system, and an electronic device including the circuit.

BACKGROUND ART

For efficient signal transmission in a wireless communication system, return loss may be measured. In addition, a feedback signal may be used to remove passive intermodulation (PIM) generated in a process of processing a radio frequency (RF) signal through a nonlinear element.

The above information is presented as background information only to assist with an understanding of the disclosure. No determination has been made, and no assertion is made, as to whether any of the above might be applicable as prior art with regard to the disclosure.

DISCLOSURE

Technical Solution

In embodiments of the disclosure, an electronic device is provided. The electronic device includes a Digital Pre-Distortion (DPD), and a digital-to-analog converter (DAC). The electronic device includes a power amplifier (PA). The electronic device includes a first coupler for obtaining a feedback signal from an output of the power amplifier. The electronic device includes a circulator for obtaining a reverse signal in which the output of the power amplifier is reflected. The electronic device includes a transmission filter. The electronic device includes a second coupler for obtaining a filter-feedback signal from an output of the transmission filter. The electronic device includes an antenna. The electronic device includes an analog-to-digital converter (ADC) for converting a composite signal including the feedback signal, the filter-feedback signal, and the reverse signal into a digital composite signal. The electronic device includes a separation circuit. The electronic device includes a pulse inter-modulation cancellation (PIMC) circuit. The separation circuit may be configured to obtain, based on the digital composite signal and an input signal of the DPD, a digital signal of the feedback signal, a digital signal of the filter-feedback signal, and a digital signal of the reverse signal.

In embodiments of the disclosure, a method performed by an electronic device is provided. The method includes obtaining a feedback signal from an output of a power amplifier (PA). The method includes obtaining a reverse signal in which the output of the power amplifier is reflected. The method includes obtaining a filter-feedback signal from an output of a transmission filter. The method includes converting a composite signal including the feedback signal, the filter-feedback signal, and the reverse signal into a digital composite signal through an analog-to-digital converter (ADC). The method includes obtaining, based on the digital composite signal and a Digital Pre-Distortion (DPD) input signal, a digital signal of the feedback signal, a digital signal of the filter-feedback signal, and a digital signal of the reverse signal.

Advantageous Effects

An electronic device and a method according to embodiments of the disclosure improve PIMC performance and enable measurement of return loss in real time, through a synthesis circuit and a separation circuit.

The effects that can be obtained from the present disclosure are not limited to those described above, and any other effects not mentioned herein will be clearly understood by those having ordinary knowledge in the art to which the present disclosure belongs, from the following description.

DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

MODE FOR INVENTION

Figure 1:
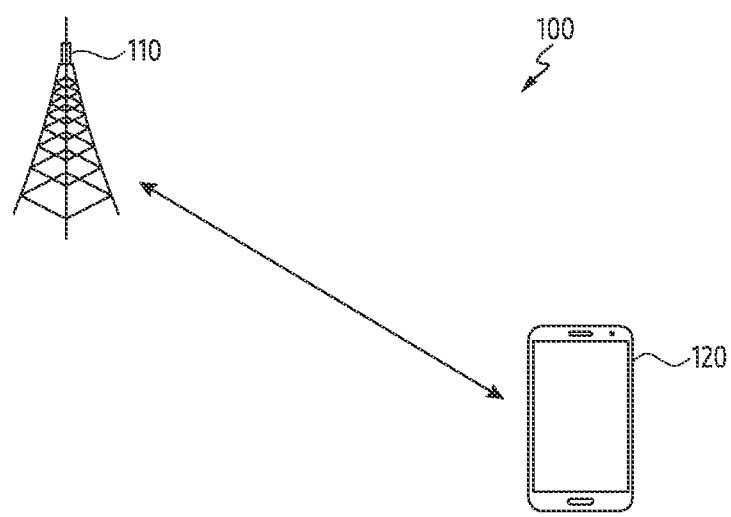
FIG. 1 illustrates a wireless communication system according to an embodiment of the disclosure.

Terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A singular expression may include a plural expression unless it is clearly meant differently in the context. The terms used herein, including a technical or scientific term, may have the same meaning as generally understood by a person having ordinary knowledge in the technical field described in the disclosure. Terms defined in a general dictionary among the terms used in the disclosure may be interpreted with the same or similar meaning as a contextual meaning of related technology, and unless clearly defined in the disclosure, it is not interpreted in an ideal or excessively formal meaning. In some cases, even terms defined in the disclosure cannot be interpreted to exclude embodiments of the disclosure.

In various embodiments of the disclosure described below, a hardware approach is described as an example. However, since the various embodiments of the disclosure include technology that use both hardware and software, the various embodiments of the disclosure do not exclude a software-based approach.

A term referring to a signal (e.g., signal, signal flow, compound signal, synthesis signal, composite signal, digital signal, analog signal, modulation signal, distortion signal), a term referring to a resource (e.g., time, symbol, slot, subframe, radio frame, subcarrier, resource element (RE), resource block (RB), bandwidth part (BWP), occasion), a term for an operational state (e.g., step, operation, procedure), a term referring to a channel, a term referring to a network entity, a term referring to a component of a device, and the like used in the following description are illustrated for convenience of description. Thus, the disclosure is not limited to terms described below, and another term having an equivalent technical meaning may be used.

A term referring to a component of an electronic device (e.g., module, antenna, antenna element, circuit, processor, chip, component, device), a term referring to a circuit (e.g., combined circuit, coupled circuit, separation circuit, distribution circuit, PIMC circuit, harmonic removal circuit), a term referring to a shape of a component (e.g., structure, construction, supporting portion, contacting portion, protruding portion), a term referring to a circuit (e.g., PCB, FPCB, signal line, feeding line, data line, RF signal line, antenna line, RF path, RF module, RF circuit, splitter, divider, coupler, combiner), and the like used in the following description are illustrated for convenience of description. Accordingly, the disclosure is not limited to terms described below, and another term having an equivalent technical meaning may be used. In addition, a term such as '... part', '... er', '... structure', '... body', and the like used below may mean at least one shape structure, or may mean a unit that processes a function.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'. In addition, hereinafter, 'A' to 'B' denotes at least one of elements from A (including A) to B (including B).

Hereinafter, the disclosure relates to an electronic device and method for measuring return loss in real time and improving passive intermodulation cancellation (PIMC) performance in a wireless communication system. Specifically, the disclosure explains a design principle of a communication circuit for measuring the return loss in real time using one analog-to-digital converter (ADC) and performing PIMC with high accuracy, in the wireless communication system.

The disclosure is to provide a method, a circuit, and an electronic device including the circuit, for obtaining a reverse signal for measuring return loss and a feedback signal for passive intermodulation cancellation (PIMC) through a small number of an analog-to-digital converter (ADC).

The disclosure is to provide a method, a circuit, and an electronic device including the circuit, for improving PIMC performance and measuring the return loss in real time.

An electronic device and a method according to embodiments of the disclosure improve PIMC performance and enable measurement of return loss in real time, through a synthesis circuit and a separation circuit.

The effects that can be obtained from the present disclosure are not limited to those described above, and any other effects not mentioned herein will be clearly understood by those having ordinary knowledge in the art to which the present disclosure belongs, from the following description.

FIG. 1 illustrates a wireless communication system according to an embodiment of the disclosure. A wireless communication environment 100 of FIG. 1 illustrates a base station 110 and a terminal 120 as a part of nodes using a wireless channel.

Referring to FIG. 1, the base station 110 is a network infrastructure that provides wireless access to the terminal 120. The base station 110 has coverage defined as a certain geographic area based on a distance capable of transmitting a signal. The base station 110 may be referred to as 'access point (AP)', 'eNodeB (eNB)', '5th generation node (5G node)', '5G NodeB (NB)', 'wireless point', 'transmission/reception point (TRP)', 'access unit', 'distributed unit (DU)', 'radio unit (RU)', 'remote radio head (RRH)', or another term having an equivalent technical meaning in addition to the base station. The base station 110 may transmit a downlink signal or may receive an uplink signal.

The terminal 120 is a device used by a user and performs communication with the base station 110 through the wireless channel. In some cases, the terminal 120 may be operated without user involvement. In other words, the terminal 120 is a device that performs machine type communication (MTC) and may not be carried by a user. The terminal 120 may be referred to as 'user equipment (UE)', 'mobile station', 'subscriber station', 'customer premises equipment (CPE)', 'remote terminal', 'wireless terminal', 'electronic device', 'terminal for vehicle', 'user device', or another term having an equivalent technical meaning in addition to the terminal.

Embodiments of the disclosure propose an electronic device and a method for separating a plurality of signals by utilizing a minimum amount of resource in the wireless communication system. Through the separation of the plurality of signals, accuracy of calculation of return loss may be improved, and performance of Passive Intermodulation Cancellation (PIMC) may be improved.

For the calculation of the return loss, an output signal of a power amplifier and a reflected signal are required. Passive intermodulation (PIM) caused by an output signal of a filter and nonlinearity by a passive element causes performance degradation in the reception band.

In order to measure the return loss, a digital signal of a feedback signal of an output of the power amplifier and a digital signal of a reverse signal using a circulator are required. Here, an analog-to-digital converter (ADC) may be used to obtain the digital signal of the feedback signal. The ADC may be used to obtain the digital signal of the reverse signal. The feedback signal may also be used as an input signal of the PIMC. For the PIMC, the feedback signal may pass through the ADC and may be continuously inputted to the PIMC. However, when the ADC is disposed for each signal requiring obtaining, a total of three ADCs including the ADC for the feedback signal, the ADC for the reverse signal, and the ADC for a reception signal are required. Thus, cost or size of a communication circuit may increase. In addition, the actual PIM is generated by the filter's output signal and the passive element, and if the feedback signal for using the return loss is used as a source of PIM removal, a characteristic of the filter is not accurately reflected, which may cause a limitation in PIMC performance.

The communication circuit including the ADC that selectively uses the feedback signal and the reverse signal may be proposed, but it is difficult for the feedback signal to be continuously inputted for the PIM removal. For the PIM removal, if DPD input is used, also, the limitation in PIMC performance is caused. In addition, since it is difficult to obtain the feedback signal and the reverse signal at the same time, a data conversion process is additionally required, and real-time calculation of the return loss is not easy.

In order to solve the above-described problem, embodiments of the disclosure propose a PIM removal method using a signal at an output terminal of the filter. In addition, according to an embodiment of the disclosure, a signal processing method for providing signals in the output terminal of the filter, the feedback signal, and the reverse signal in a digital section through one ADC and a communication circuit in which the signal processing method is implemented are proposed.

Figure 2:
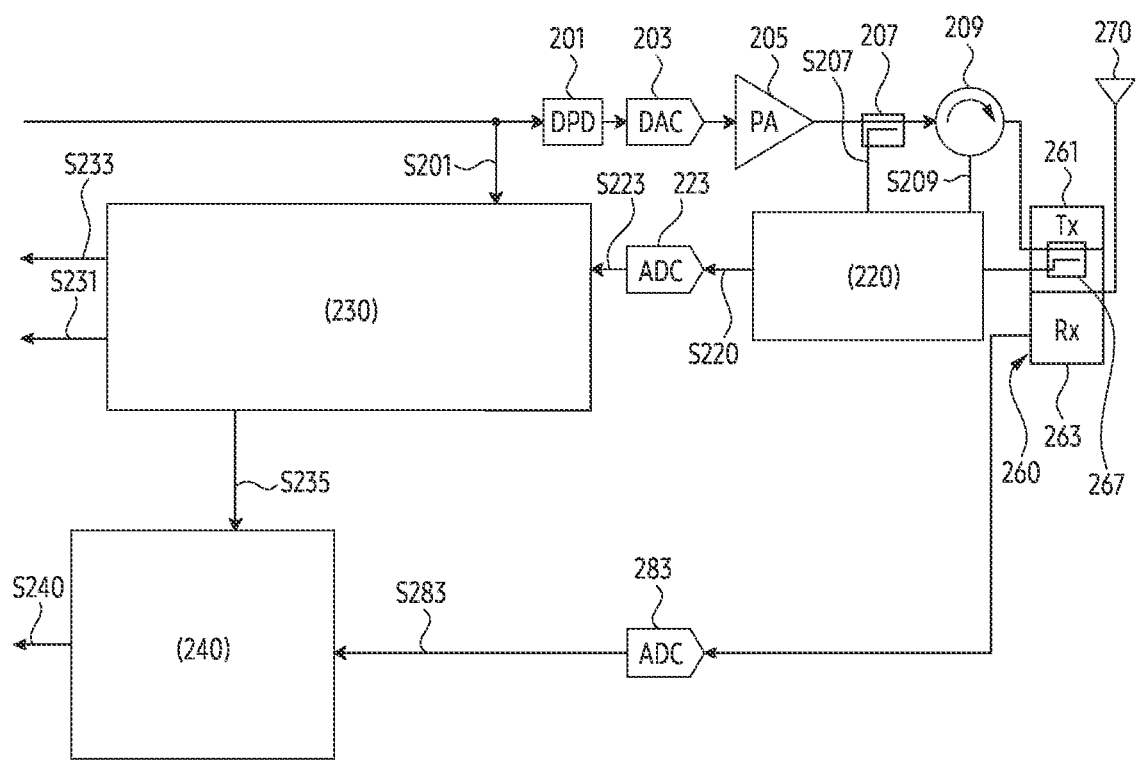
FIG. 2 illustrates a functional configuration of a communication circuit according to an embodiment of the disclosure.

FIG. 2 illustrates a functional configuration of a communication circuit according to an embodiment of the disclosure.

Referring to FIG. 2, a communication circuit 200 may include a digital predistortion (DPD) 201. The DPD 201 may perform distortion of a digital signal in advance through digital signal processing in order to improve nonlinearity of an RF component (e.g., power amplifier (PA) 205) of a signal. The signal inputted to the DPD 201 may be referred to as a DPD input signal S201. The DPD input signal S201 may be provided to a separation circuit 230 for distributing a composite signal to be described later. An output signal of the DPD 201 may be provided to a digital-to-analog converter (DAC) 203.

The communication circuit 200 may include the DAC 203. The DAC 203 may convert the output signal of the DPD 201 from a digital domain to an analog domain.

The communication circuit 200 may include the PA 205. The PA 205 may amplify an inputted signal. The PA 205 may amplify an analog signal that has passed through the DAC 203.

The communication circuit 200 may include a coupler 207. The coupler 207 may be a directional coupler. The directional coupler denotes a device inserted into a line between an RF source and a load. The directional coupler may provide RF power corresponding to a forward direction and power reflected from the load to the source. The coupler 207 may be positioned on a transmission path before a circulator 209 after an output terminal of the PA 205. The coupler 207 may provide an output signal (i.e., an amplified signal) of the PA 205 to a synthesis circuit 220. The signal extracted through the coupler 207 may be referred to as a feedback signal S207.

The communication circuit 200 may include the circulator 209. The circulator 209 may reflect the inputted signal. In other words, the circulator 209 may output a reflected signal of the inputted signal. In other words, the circulator 209 may output a signal reflected from a filter end. The signal outputted from the circulator 209 may be referred to as a reverse signal S209. The reverse signal S209 may be provided to the synthesis circuit 220.

The communication circuit 200 may include a filter 260. The filter 260 is a component that provides filtering to transmit a signal of a desired frequency. The filter 260 may perform a function of selectively identifying the frequency by forming a resonance. The filter 260 may include at least one of a band pass filter, a low pass filter, a high pass filter, or a band reject filter. The filter 260 may include a TX (transmit) filter 261. The filter 260 may include an RX (receive) filter 263.

The communication circuit 200 may include the TX (transmit) filter 261. The TX (transmit) filter 261 may filter the inputted signal so that only a signal in a specific frequency range is transmitted to an antenna 270.

The communication circuit 200 may include the RX (receive) filter 263. The RX (receive) filter 263 may filter the signal received from the antenna 270 so that only the signal in a specific frequency range is processed.

The communication circuit 200 may include the antenna 270. The antenna 270 denotes a radiator for transmitting a signal into the air.

The communication circuit 200 may include a coupler 267. The coupler 267 may be the directional coupler. The coupler 267 may be positioned between an output terminal of the TX (transmit) filter 261 and the antenna 270. The coupler 267 may provide an output signal of the TX (transmit) filter 261 to the synthesis circuit 220. The output signal of the TX (transmit) filter 261 extracted through the coupler 267 may be referred to as a filter-feedback signal S267.

The communication circuit 200 may include the synthesis circuit 220. The synthesis circuit 220 may receive the feedback signal S207 derived from the coupler 207 as an input. The synthesis circuit 220 may receive the reverse signal S209 derived from the circulator 209 as the input. The synthesis circuit 220 may receive the filter-feedback signal S267 derived from the coupler 267 as an input. The synthesis circuit 220 may couple the feedback signal, the filter-feedback signal, and the reverse signal. The synthesis circuit 220 may obtain a composite signal S220 by coupling the feedback signal, the filter-feedback signal, and the reverse signal. Components of the synthesis circuit 220 are described in detail through FIG. 3.

The communication circuit 200 may include an ADC 223. The ADC 223 according to embodiments of the disclosure may convert the composite signal S220 including all of the feedback signal, the filter-feedback signal, and the reverse signal from the analog domain to the digital domain. The design of the communication circuit 200 may be efficiently achieved by performing digital conversion on the feedback signal, the filter-feedback signal, and the reverse signals using only one ADC 223 except for an ADC 283 for a reception circuit. The ADC 223 may output a digital composite signal S223 by converting the inputted composite signal.

The communication circuit 200 may include the separation circuit 230. The separation circuit 230 may be referred to as a distribution circuit, a division circuit, an extraction circuit, or a name having the same technical meaning with these. The separation circuit 230 may receive the DPD input signal S201 as an input. The separation circuit 230 may receive the digital composite signal S223 as an input. The separation circuit 230 may receive the digital composite signal S223 from the ADC 223. The separation circuit 230 may perform distribution based on the DPD input signal S201 and the digital composite signal S223.

The separation circuit 230 may obtain a reverse signal S233 from the composite signal. For example, the reverse signal may be obtained based on the equations described in FIG. 7A. The separation circuit 230 may obtain a feedback signal S231 from the composite signal. For example, the feedback signal may be obtained based on the equations described in FIG. 7B. The separation circuit 230 may obtain a filter-feedback signal S235 from the composite signal. For example, the filter-feedback signal may be obtained based on the equations described in FIG. 7C. Components of the separation circuit 230 are described in detail through FIG. 4.

The communication circuit 200 may include the ADC 283. The ADC 283 may convert a reception signal derived through the antenna 270 and the RX (receive) filter 263 from the analog domain to the digital domain. The ADC 283 may output the reception signal (hereinafter, a digital reception signal) S283 of the digital domain. The digital reception signal S283 may be provided to a PIMC circuit 240.

The communication circuit 200 may include the passive intermodulation cancellation (PIMC) circuit 240. The PIMC circuit 240 may perform PIM removal based on the filter-feedback signal S235 and the digital reception signal S283. The PIMC circuit 240 may output a signal S240 through the PIM removal. Components of the PIMC circuit 240 are described in detail through FIG. 5.

Referring to FIG. 2, various components are described for processing a signal transmitted through an amplifier.

In order to explain a disposition and an operation principle of the synthesis circuit 220, the separation circuit 230, and the PIMC circuit 240, components for the transmission path or components for a reception path are illustrated in FIG. 2. For example, the DPD 201, the DAC 203, the PA 205, and the TX (transmit) filter 261 are illustrated to describe the transmission path. Thus, embodiments of the disclosure are not limitedly interpreted to the components illustrated in FIG. 2. For example, it goes without saying that additional components (e.g., phase shifter) not illustrated in FIG. 2 may be disposed in the communication circuit between the components of the transmission path. In addition, for example, at least some of the components of the transmission path may be disposed in another position, omitted, or replaced.

Figure 3:
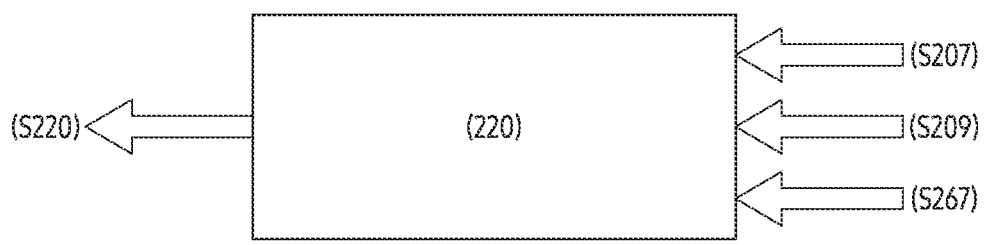
FIG. 3 illustrates a functional configuration of a synthesis circuit according to an embodiment of the disclosure.

FIG. 3 illustrates a functional configuration of a synthesis circuit according to an embodiment of the disclosure. According to an embodiment, the synthesis circuit may be a synthesis circuit 220 of FIG. 2.

Referring to FIG. 3, the synthesis circuit 220 may obtain a feedback signal S207, a reverse signal S209, and a filter-feedback signal S267 as an input. The feedback signal S207 is an analog signal. The reverse signal S209 is the analog signal. The filter-feedback signal S267 is the analog signal. The processing of the synthesis circuit 220 may be performed in an analog domain. According to an embodiment, the synthesis circuit 220 may include an attenuation circuit. The attenuation circuit may be used to lower the amplitude of the reverse signal. The synthesis circuit 220 may obtain a composite signal by coupling an output of the attenuation circuit, the feedback signal S207, and the filter-feedback signal S267. According to an embodiment, the synthesis circuit 220 may include an adder for the coupling.

In order to convert the analog signals into a digital signal through one ADC, the synthesis circuit 220 may output the composite signal. The synthesis circuit 220 may output the composite signal to be inputted to the ADC. Although not illustrated in FIG. 3, the composite signal may be converted into a digital composite signal through the one ADC.

Figure 4:
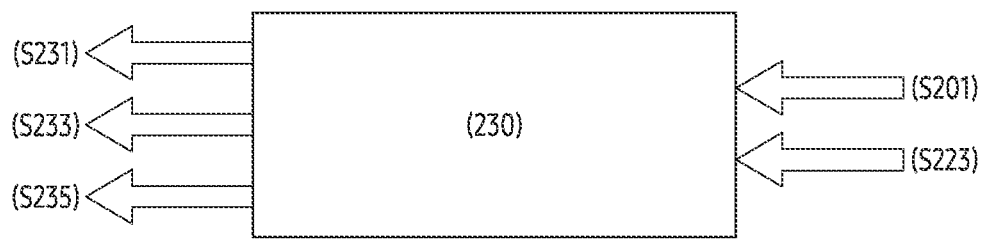
FIG. 4 illustrates a functional configuration of a separation circuit according to an embodiment of the disclosure.

FIG. 4 illustrates a functional configuration of a separation circuit according to an embodiment of the disclosure. According to an embodiment, the separation circuit may be a separation circuit 230 of FIG. 2.

Referring to FIG. 4, the separation circuit 230 may obtain a DPD input signal S201 as an input. The separation circuit 230 may obtain a digital composite signal S223 as an input. The processing of the separation circuit 230 may be performed in a digital domain.

The separation circuit 230 may obtain a feedback signal S231 based on the DPD input signal S201 and the digital composite signal S223. The feedback signal S231 is a digital signal. The separation circuit 230 may obtain a reverse signal S233 based on the DPD input signal S201 and the digital composite signal S223. The reverse signal S233 is the digital signal. The separation circuit 230 may obtain a filter-feedback signal S235 based on the DPD input signal S201 and the digital composite signal S223. The filter-feedback signal S235 is the digital signal.

1. Reverse Signal Extraction

The separation circuit 230 may generate an estimated feedback signal based on the DPD input signal S201. A magnitude compensation value and a delay compensation value may be obtained based on a magnitude and a delay value of the feedback signal. The estimated feedback signal may be generated by applying the magnitude compensation value and the delay compensation value to the DPD input signal S201. According to an embodiment, the separation circuit 230 may include an operator for obtaining the magnitude compensation value and the delay compensation value. According to an embodiment, the separation circuit 230 may include a multiplier for applying the magnitude compensation value and the delay compensation value to the DPD input signal S201.

The separation circuit 230 may remove the estimated feedback signal from the digital composite signal S223. The separation circuit 230 may obtain a reference signal by removing the estimated feedback signal from the digital composite signal S223. The separation circuit 230 may include a subtractor for the removal operation. The separation circuit 230 may include a compensation circuit for compensating the delay in the operator after the removal. The separation circuit 230 may obtain the reference signal by compensating the delay to the signal which the estimated feedback signal is removed from the digital composite signal S223.

The separation circuit 230 may generate an estimated filter-feedback signal based on the DPD input signal S201. The magnitude compensation value and the delay compensation value may be obtained based on a magnitude and delay a value of the filter-feedback signal. The estimated filter-feedback signal may be generated by applying the magnitude compensation value and the delay compensation value to the DPD input signal S201. According to an embodiment, the separation circuit 230 may include the operator for obtaining the magnitude compensation value and the delay compensation value. According to an embodiment, the separation circuit 230 may include the multiplier for applying the magnitude compensation value and the delay compensation value to the DPD input signal S201.

The separation circuit 230 may remove the estimated filter-feedback signal from the reference signal. The separation circuit 230 may obtain the reverse signal by removing the estimated filter-feedback signal from the reference signal. The separation circuit 230 may include the subtractor for the removal operation.

2. Feedback Signal Extraction

Hereinafter, components of the separation circuit 230 for the extraction of the feedback signal are described, but it goes without saying that the extraction of the feedback signal may be performed in combination with components required for the extraction of the reverse signal of Section 1. In addition, the extraction of the feedback signal may be performed in combination with components required for extraction of the filter-feedback signal of Section 3.

The separation circuit 230 may remove the reference signal from the digital composite signal. The separation circuit 230 may perform delay compensation on the digital composite signal. Here, the delay compensation denotes an operation for compensating a delay of circuits used to obtain the reference signal. The separation circuit 230 may include the compensation circuit for the delay compensation. The feedback signal may be obtained by removing the reference signal from the compensated digital composite signal. The separation circuit 230 may include the subtractor for the removal operation.

3. Filter-Feedback Signal Extraction

Components of the separation circuit 230 for the extraction of the filter-feedback signal are described, but the extraction of the filter-feedback signal may be performed in combination with at least one of the components required for the extraction of the reverse signal of the Section 1 or components required for the extraction of the feedback signal of Section 2.

The separation circuit 230 may remove the reverse signal from the reference signal. The separation circuit 230 may perform the delay compensation on the reference signal. Here, the delay compensation denotes an operation for compensating a delay of circuits used to obtain the reverse signal. The separation circuit 230 may include the compensation circuit for the delay compensation. The filter-feedback signal may be obtained by removing the reverse signal from the compensated reference signal. The separation circuit 230 may include the subtractor for the removal operation.

Figure 5:
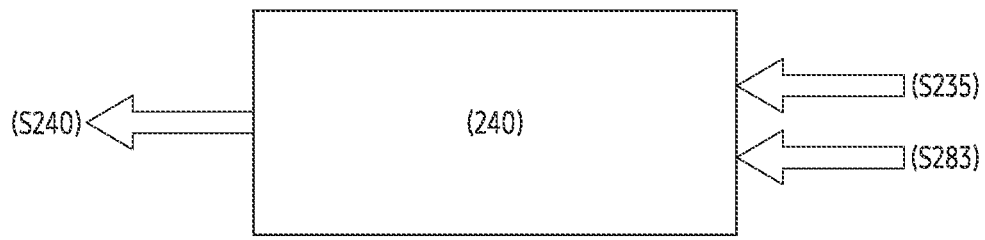
FIG. 5 illustrates a functional configuration of a passive intermodulation cancellation (PIMC) circuit according to an embodiment of the disclosure.

FIG. 5 illustrates a functional configuration of a passive intermodulation cancellation (PIMC) circuit according to an embodiment of the disclosure. According to an embodiment, the PIMC circuit may be a PIMC circuit 240 of FIG. 2.

Referring to FIG. 5, the PIMC circuit 240 may obtain a filter-feedback signal S235 as an input. The PIMC circuit 240 may obtain a digital reception signal S283 as an input. The processing of a separation circuit 230 may be performed in a digital domain.

The PIMC circuit 240 may obtain a signal S240 based on the filter-feedback signal S235 and the digital reception signal S283. The signal S240 is a digital signal. The PIMC circuit 240 may obtain the signal S240 through PIM removal. The PIM denotes an unnecessary interference component generated due to a harmonic generated by a frequency that is a multiple of a frequency of an original signal. The PIMC circuit 240 may remove the unnecessary interference component from the digital reception signal obtained through a RX (receive) filter and an ADC.

Figure 6:
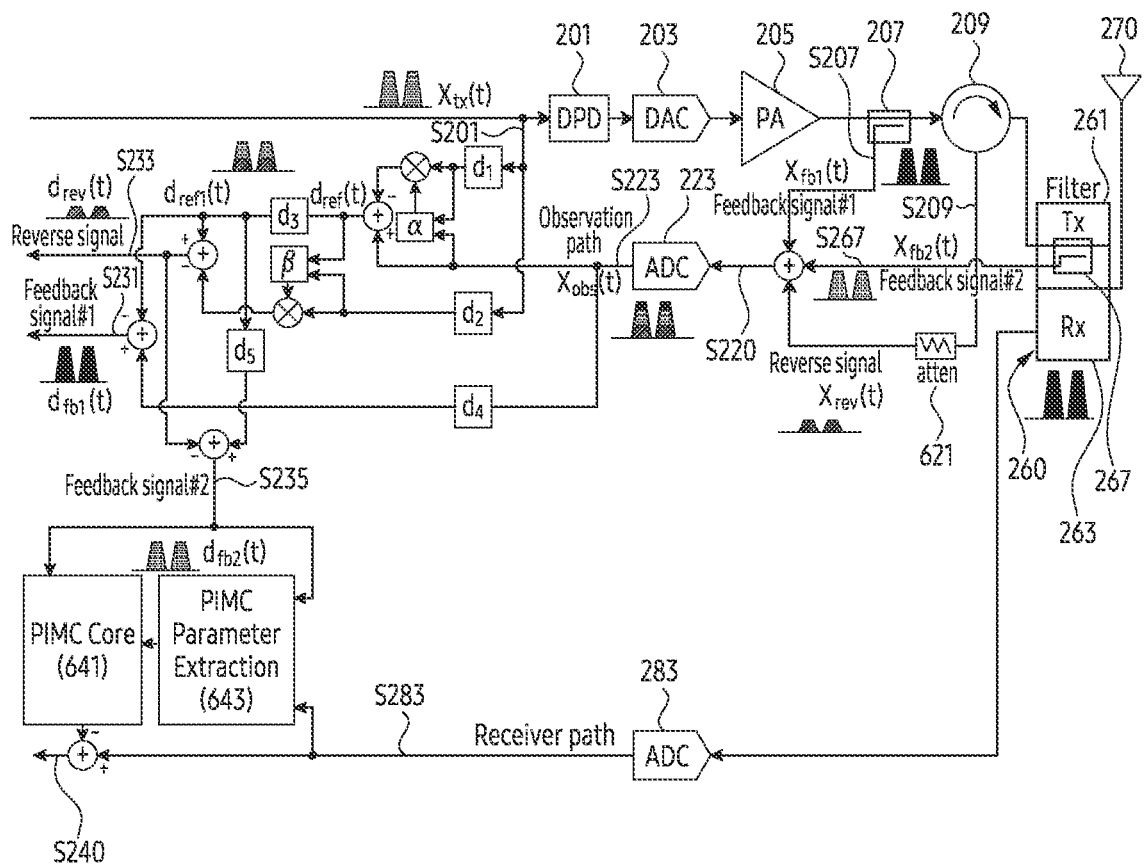
FIG. 6 illustrates an example of a communication circuit including a synthesis circuit and a separation circuit according to an embodiment of the disclosure.

FIG. 6 illustrates an example of a communication circuit including a synthesis circuit and a separation circuit according to an embodiment of the disclosure. The communication circuit of FIG. 6 illustrates a circuit in which logic operation circuits and RF components described through FIGS. 2 to 5 are disposed. A structure of the communication circuit of FIG. 6 is an embodiment for describing embodiments of the disclosure and is not interpreted as limiting other embodiments.

Referring to FIG. 6, according to an embodiment, the communication circuit may include a coupler 207 for extracting a feedback signal S207 from an output of a PA 205. According to an embodiment, the communication circuit may include a coupler 267 for extracting a filter-feedback signal S267 from an output of a filter 260. According to an embodiment, the communication circuit may include a circulator 209 for obtaining a signal reflected from an output signal of the PA 205, that is, a reverse signal S209.

According to an embodiment, the synthesis circuit may include an attenuation circuit. An attenuation circuit 621 may obtain the reverse signal S209 as an input signal. The attenuation circuit 621 may be configured to attenuate a magnitude of the reverse signal S209. Meanwhile, unlike illustrated in FIG. 6, in some other embodiments, the attenuation circuit 621 may be omitted. According to an embodiment, the synthesis circuit may include an adder. The adder may output a composite signal that is a sum of the feedback signal S207, the filter-feedback signal S267, and the reverse signal S209 (or an output of the attenuation circuit 621).

An ADC 223 according to embodiments of the disclosure may convert a composite signal S220 from an analog domain to a digital domain. An analog-to-digital conversion procedure of the communication circuit may be simplified by converting the composite signal S220 through the ADC 223, which is a single component, instead of converting the feedback signals (e.g., the feedback signal S207, the filter-feedback signal S267, and the reverse signal S209) respectively. The simplified procedure enables efficient design of the communication circuit. The ADC 223 may output a digital composite signal through the conversion.

The separation circuit may include compensation circuits, subtractor circuits, and operation circuits.

According to an embodiment, the separation circuit may include a first compensation circuit d1 for compensating a correlation delay between the feedback signal S207 and a DPD input signal S201.

According to an embodiment, the separation circuit may include a first operation circuit for compensating a magnitude and phase α of the DPD input signal S201 in order to remove a component of the feedback signal S207. The first operation circuit may output an estimated feedback signal.

According to an embodiment, the separation circuit may include the subtractor circuit for removing the estimated feedback signal from a digital composite signal S223. An output of the subtractor may be referred to as a reference signal $d_{ref}(t)$.

According to an embodiment, the separation circuit may include a second compensation circuit for compensating both d2 the correlation delay between the filter-feedback signal S267 and the DPD input signal and the delay of the subtractor circuit.

According to an embodiment, the separation circuit may include a second operation circuit for compensating the magnitude and phase β of the DPD input signal S201 in order to remove the component of the filter-feedback signal S267. The second operation circuit may output an estimated filter-feedback signal.

According to an embodiment, the separation circuit may include a third compensation circuit for compensating a delay d3 of the operation circuit to the reference signal.

According to an embodiment, the separation circuit may include the subtractor circuit for extracting a reverse signal S233 $d_{rev}(t)$ by removing the estimated filter-feedback signal from the reference signal (hereinafter, a compensation reference signal) $d_{refl}(t)$ compensated through the compensation circuit.

According to an embodiment, the separation circuit may include a fourth compensation circuit for compensating for a delay d4 used to obtain the compensation reference signal $d_{refl}(t)$.

According to an embodiment, the separation circuit may include the subtractor circuit for extracting a feedback signal S231 $d_{fb1}(t)$ by removing the compensation reference signal from the digital composite signal that has passed through the fourth compensation circuit, in other words, a compensation signal.

According to an embodiment, the separation circuit may include a fifth compensation circuit for compensating for a delay d5 of the subtractor circuit used to obtain the reverse signal.

According to an embodiment, the separation circuit may include the subtractor circuit for extracting a filter-feedback signal S235 $d_{fb2}(t)$ by removing the reverse signal from the compensation reference signal (hereinafter, the compensation signal) that has passed through the fifth compensation circuit.

A PIMC circuit may include a PIMC core 641, a PIMC parameter extraction unit 643, and the subtractor.

According to an embodiment, the PIMC parameter extraction unit 643 may receive a digital reception signal S283 as the input signal. The digital reception signal S283 may be obtained as a signal received through an antenna passes through an RX (receive) filter 263 and an ADC 283. The PIMC parameter extraction unit 643 may obtain the filter-feedback signal as the input signal. The PIMC parameter extraction unit 643 may output at least one parameter. The PIMC parameter extraction unit 643 may provide the at least one parameter to the PIMC core 641.

According to an embodiment, the PIMC core 641 may obtain the filter-feedback signal as the input signal. The PIMC core 641 may obtain the at least one parameter of the PIMC parameter extraction unit as the input signal. The PIMC core 641 may output an interference signal. The PIMC core 641 may provide the interference signal to the subtractor. The subtractor may remove the interference signal from the digital reception signal S283. The subtractor may output a signal S240 by removing the interference signal from the digital reception signal S283. The signal S240 may be a signal from which an unnecessary interference component, in other words, a PIM, is removed.

Figure 7A:
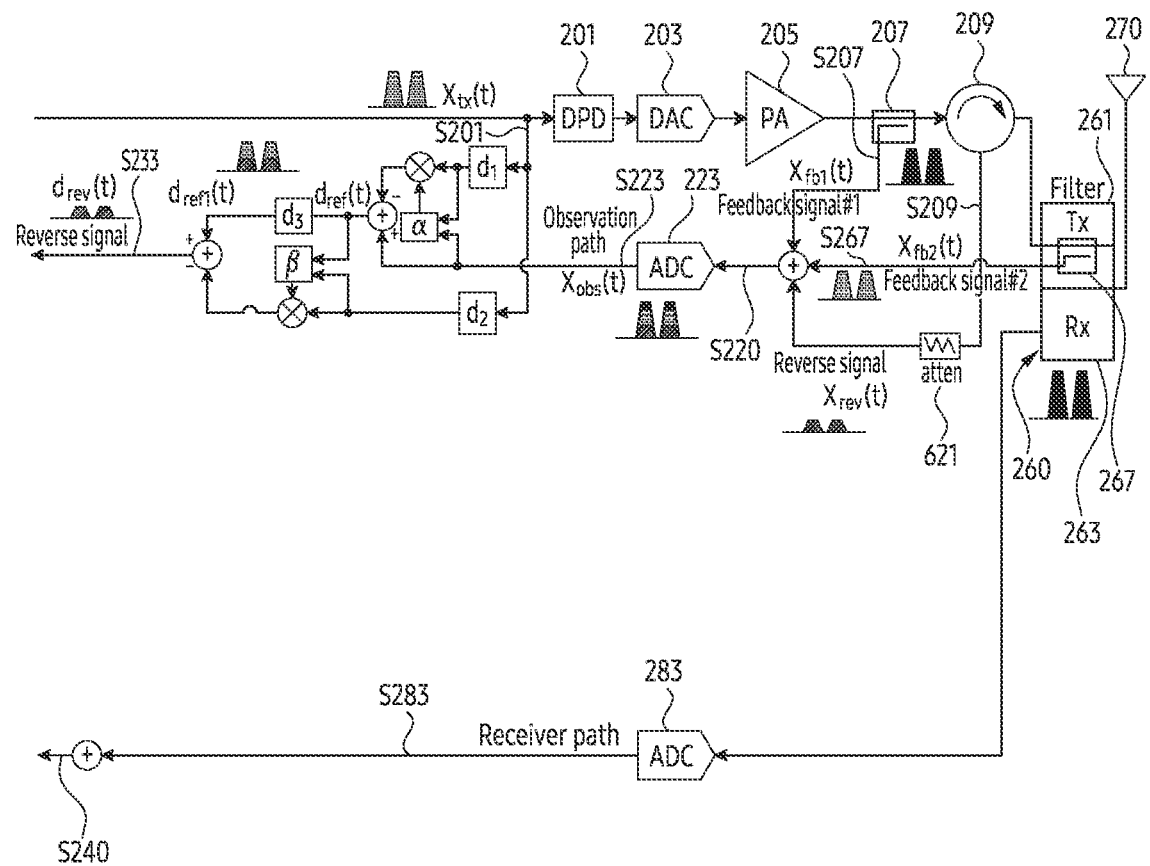
FIG. 7A illustrates an example of obtaining a reverse signal using a communication circuit according to an embodiment of the disclosure.
Figure 7B:
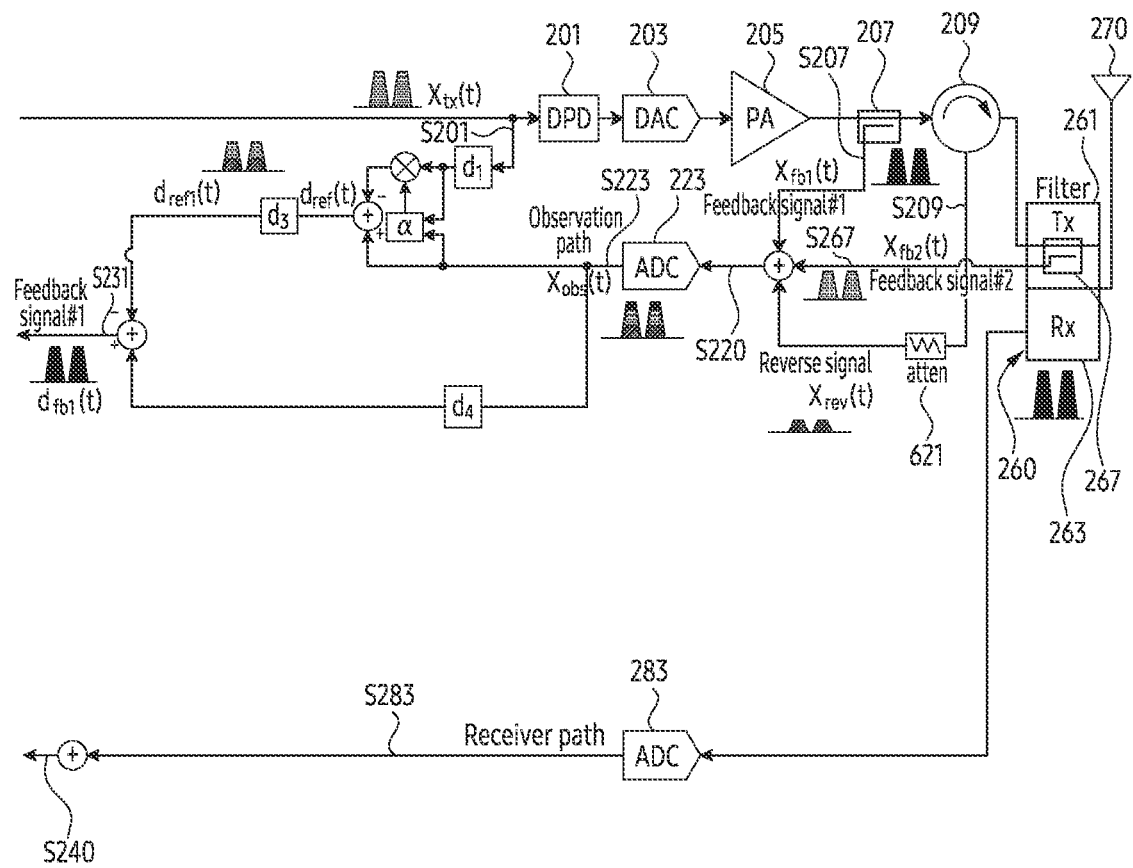
FIG. 7B illustrates an example of obtaining a feedback signal using a communication circuit according to an embodiment of the disclosure.
Figure 7C:
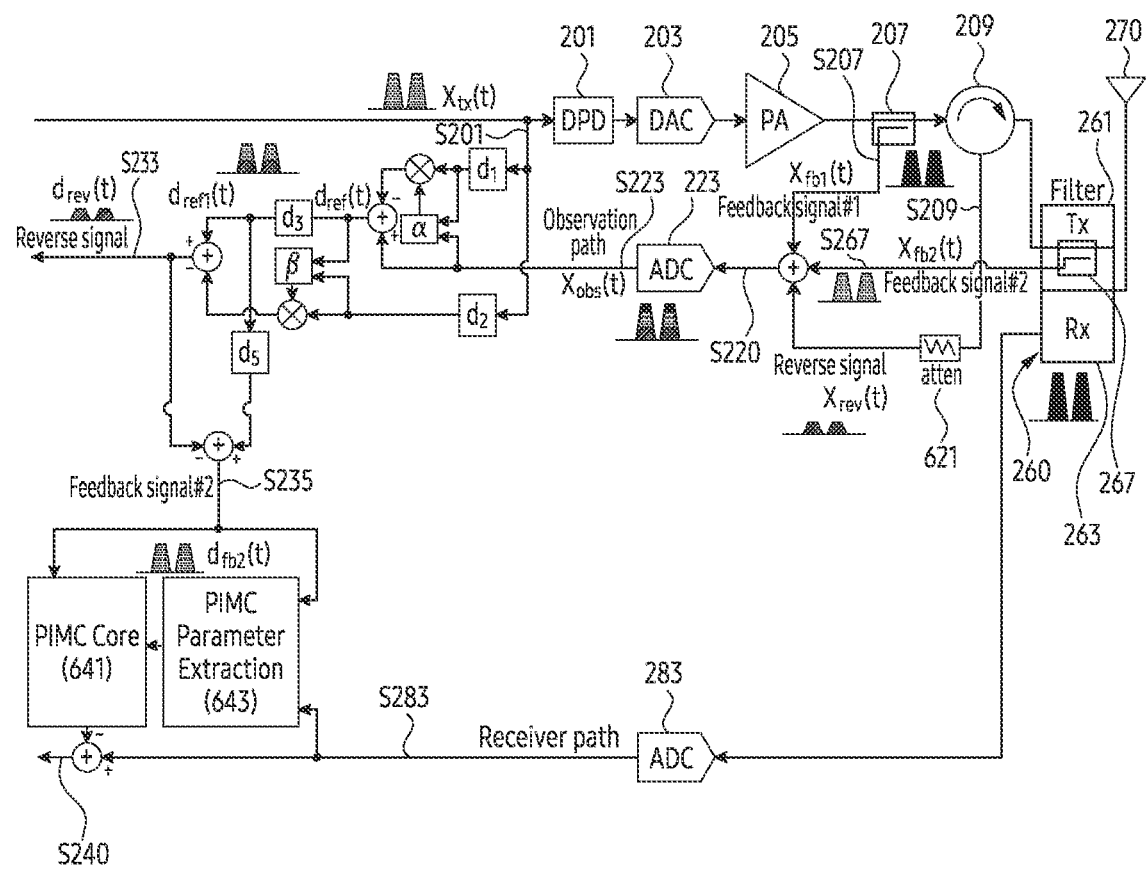
FIG. 7C illustrates an example of obtaining a filter-feedback signal using a communication circuit according to an embodiment of the disclosure.

Hereinafter, detailed operations of the separation circuit using the subtractor circuits, operation circuits, and compensation circuits illustrated in FIG. 6 are described through FIGS. 7A to 7C. FIG. 7A describes an operation of the separation circuit for extraction of the reverse signal in the digital domain according to an embodiment of the disclosure. FIG. 7B describes the operation of the separation circuit for extraction of the feedback signal in the digital domain according to an embodiment of the disclosure. FIG. 7C describes the operation of the separation circuit for extraction of the filter-feedback signal in the digital domain according to an embodiment of the disclosure.

FIG. 7A illustrates an example of obtaining a reverse signal using a communication circuit according to embodiments. In the description of FIG. 7A, even if a digital signal is converted into an analog signal or the analog signal is converted into the digital signal, since properties of the signal are the same in the same ADC, the signals having the same contents may be expressed with the same symbol.

Referring to FIG. 7A, an input signal may pass through a DPD 201, a DAC 203, and a PA 205. The passed input signal may be referred to as an output signal. The output signal may be the analog signal. A coupler 207 may output a feedback signal based on the output signal. For example, the feedback signal may be expressed by the following equation.

$$X_{fb1}(t)=\alpha^{*}X_{tx}(t-\Delta t_1) \qquad \text{Equation 1}$$

Here, $X_{fb1}(t)$ represents the feedback signal, $X_{tx}(t)$ represents the input signal, and α represents a feedback signal coefficient. $\Delta t_1$ represents a delay of the feedback signal.

An output signal of the PA 205 may be inputted to a filter 260. A coupler 267 may output a filter-feedback signal based on an output signal of a TX (transmit) filter 261 of the filter 260. For example, the filter-feedback signal may be expressed by the following equation.

$$X_{fb2}(t)=\beta^{*}X_{tx}(t-\Delta t_2) \qquad \text{Equation 2}$$

Here, $X_{fb2}(t)$ represents the filter-feedback signal, $X_{tx}(t)$ represents the input signal, and β represents a filter-feedback signal coefficient. $\Delta t_2$ represents a delay of the filter-feedback signal. The output signal of the PA 205 may pass through a circulator 209 and may be inputted to an attenuation circuit 621. The attenuation circuit 621 may output the reverse signal. For example, the reverse signal may be expressed by the following equation.

$$X_{rev}(t)=\gamma^{*}X_{fb1}(t-\Delta t_3) \qquad \text{Equation 3}$$

Here, $X_{rev}(t)$ represents the reverse signal, $X_{fb1}(t)$ represents the feedback signal, and γ represents a reverse signal coefficient. $\Delta t_3$ represents a delay of the reverse signal.

The feedback signal, the filter-feedback signal, and the reverse-signal may be synthesized. A signal in which the feedback signal, the filter-feedback signal, and the reverse-signal are synthesized may be referred to as a composite signal. The composite signal may be referred to as an observation signal, an integration signal, a combination signal, or a name having the same technical meaning. The composite signal may be converted into a digital composite signal through an ADC 223. For example, the digital composite signal may be expressed by the following equation.

$$X_{obs}(t)=X_{fb1}(t)+X_{fb2}(t)+X_{rev}(t)=\alpha^{*}X_{tx}(t-\Delta t_1)+\beta^{*}X_{tx}(t-\Delta t_2)+\gamma^{*}X_{fb1}(t-\Delta t_3) \qquad \text{Equation 4}$$

Here, $X_{obs}(t)$ represents the digital composite signal.

Referring to Equation 4, among the digital composite signal, it is confirmed that the feedback signal and the filter-feedback signal are related to the input signal. According to an embodiment, the communication circuit may estimate each signal using a delay compensation circuit at different correlation and a delay compensation circuit according to subtraction.

The input signal may be changed into an estimated feedback signal through a magnitude correction circuit and a phase correction circuit. The estimated feedback signal represents a signal corrected to be the same as or similar to an actual feedback signal from the input signal. The estimated feedback signal may be the digital signal. The input signal may be changed into an estimated filter-feedback signal through the magnitude correction circuit and the phase correction circuit. The estimated filter-feedback signal represents a signal corrected to be the same as or similar to an actual filter-feedback signal from the input signal. The estimated filter-feedback signal may be the digital signal.

The reverse signal may be obtained by removing the estimated feedback signal and the estimated filter-feedback signal from the digital composite signal. For example, the reverse signal may be obtained through the following equations.

$$d_{ref}(t)=X_{obs}(t)-\alpha*X_{tx}(t-d_1) \quad \text{Equation 5}$$

$d_{ref}(t)$ represents a first reference signal. The first reference signal denotes a signal from which the estimated feedback signal is removed from the digital composite signal. $X_{obs}(t)$ represents the digital composite signal. $X_{tx}(t)$ represents the input signal. α represents the feedback signal coefficient. $d_1$ represents a delay compensation of the feedback signal.

$$d_{refl}(t)=d_{ref}(t-d_3) \quad \text{Equation 6}$$

$d_{refl}(t)$ represents a second reference signal. The second reference signal denotes a signal in which a delay is compensated in the first reference signal. $d_3$ represents the delay compensation of the feedback signal. Referring to Equation 3, since the reverse signal includes an additional delay from the feedback signal, a delay compensation of the first reference signal is required to obtain the reverse signal.

$$d_{rev}(t)=d_{refl}(t)-\beta*X_{tx}(t-d_2) \quad \text{Equation 7}$$

$d_{rev}(t)$ represents the reverse signal. β represents the filter-feedback signal coefficient. $d_2$ represents a delay compensation of the filter-feedback signal. The reverse signal may be obtained by removing the estimated filter-feedback signal from the second reference signal. The obtained reverse signal may be the digital signal.

FIG. 7B illustrates an example of obtaining a feedback signal using a communication circuit according to embodiments. In the description of FIG. 7B, even if a digital signal is converted into an analog signal or the analog signal is converted into the digital signal, since properties of the signal are the same in the same ADC, they may be expressed with the same symbol.

Referring to FIG. 7B, a first reference signal may include a component of a filter-feedback signal and a component of a reverse signal in a composite signal. This is because the first reference signal is obtained by removing an estimated feedback signal from the composite signal. The communication circuit may obtain the feedback signal by inversely using a process of obtaining the first reference signal. For example, the feedback signal may be obtained through the following equation.

$$d_{fb1}(t)=X_{obs}(t-d_4)-d_{refl}(t) \quad \text{Equation 8}$$

$d_{fb1}(t)$ represents the feedback signal. $X_{obs}(t)$ represents the composite signal. $d_{refl}(t)$ represents a second reference signal. $d_4$ represents a delay compensation used to obtain the second reference signal. For example, the delay compensation used to obtain the second reference signal may include at least one of $d_1$ of Equation 5 or $d_3$ of Equation 6. The feedback signal may be obtained by removing the second reference signal from the delay compensated composite signal. The obtained feedback signal may be the digital signal.

FIG. 7C illustrates an example of obtaining a filter-feedback signal using a communication circuit according to embodiments. In the description of FIG. 7C, even if a digital signal is converted into an analog signal or the analog signal is converted into the digital signal, since properties of the signal are the same in the same ADC, they may be expressed with the same symbol.

Referring to FIG. 7C, a second reference signal may include a component of a filter-feedback signal and a component of a reverse signal in a composite signal. This is because the second reference signal is obtained by removing an estimated feedback signal from the composite signal. The communication circuit may obtain the feedback signal by inversely using a process of obtaining the second reference signal. For example, the filter-feedback signal may be obtained through the following equation.

$$d_{fb2}(t)=d_{refl}(t-d_5)-d_{rev}(t) \quad \text{Equation 9}$$

$d_{fb2}(t)$ represents the filter-feedback signal. $d_{refl}(t)$ represents the second reference signal. $d_{rev}(t)$ represents the reverse signal obtained through Equation 7. $d_5$ represents a delay compensation of a subtractor for the reverse signal. The filter-feedback signal may be obtained by removing the second reference signal from the delay compensated composite signal. The obtained filter-feedback signal may be the digital signal.

Return loss may be calculated based on the reverse signal and the feedback signal obtained through FIGS. 7A to 7C. For example, the return loss may be calculated based on the following equation.

$$\text{Return Loss [dB]}=10*\log_{10}(\Sigma|d_{fb1}(t)|^2-\Sigma|d_{rev}(t)|^2) \quad \text{Equation 10}$$

Return Loss represents the return loss. $d_{fb1}(t)$ represents the feedback signal. $d_{rev}(t)$ represents the reverse signal.

Through the one ADC, the communication circuit may obtain the feedback signal, the filter-feedback signal, and the reverse signal. As the filter-feedback signal is supplied to PIMC, accurate PIM removal may be achieved. In addition, since a switch is not used, the filter-feedback signal and the reverse signal are constantly inputted. Thus, the electronic device is capable of continuous RL calculation.

Figure 8:
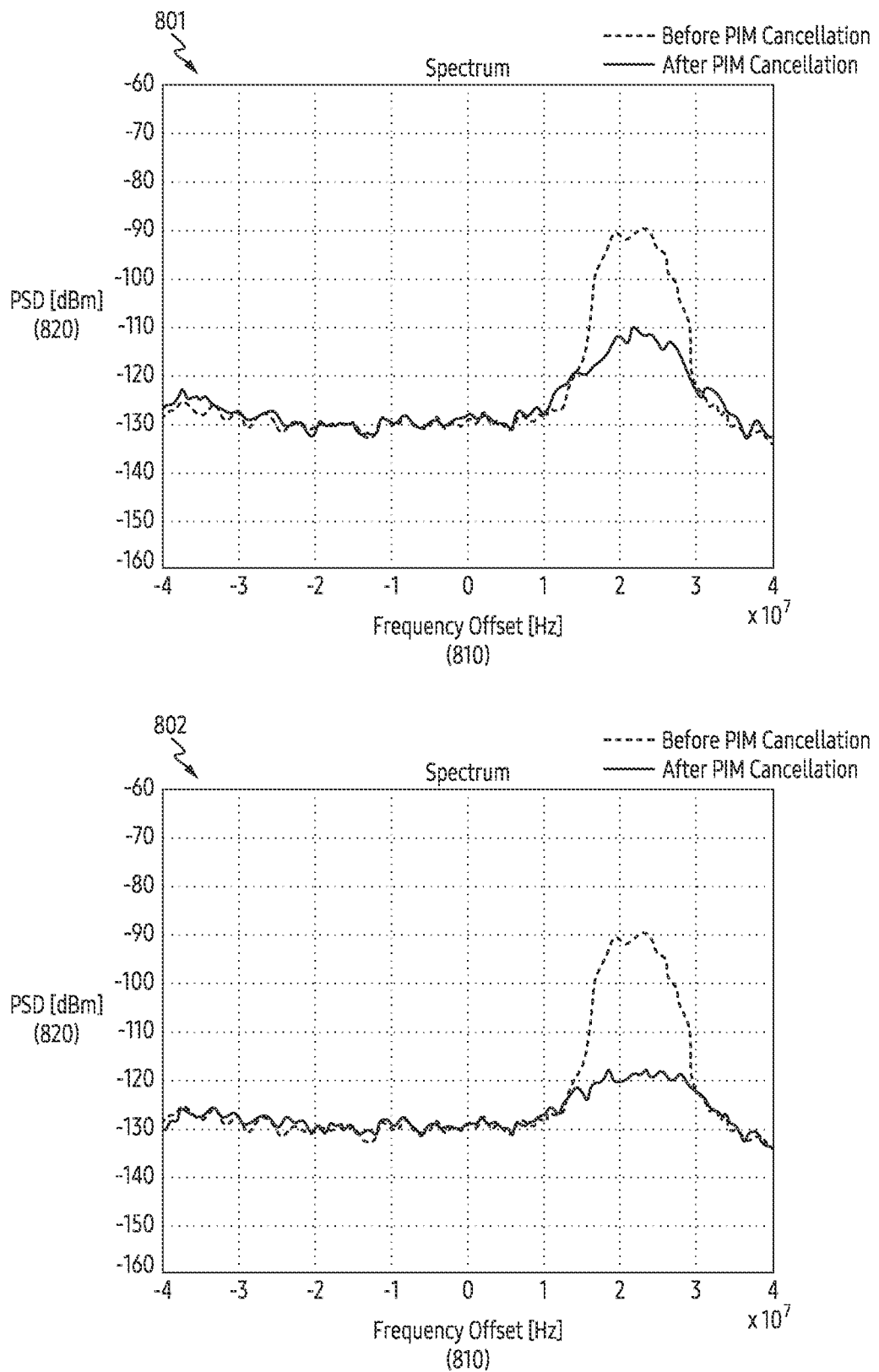
FIG. 8 illustrates performance of a communication circuit including a synthesis circuit and a separation circuit according to an embodiment of the disclosure.

FIG. 8 illustrates performance of a communication circuit including a synthesis circuit and a separation circuit according to an embodiment of the disclosure. The performance of the communication circuit denotes a performance of PIM removal.

Referring to FIG. 8, a graph 801 illustrates the performance of the PIM removal using a feedback signal that has not passed through a filter. A horizontal axis 810 of the graph 801 represents a frequency offset (unit: hertz (Hz)). A vertical axis 820 of the graph 801 represents power spectral density (PSD) (unit: decibel milliwatt (dBm)). A graph 802 represents the performance of the PIM removal using the feedback signal that has passed through the filter, in other words, a filter-feedback signal. The horizontal axis 810 of the graph 802 represents the frequency offset. The vertical axis 820 of the graph 802 represents the PSD (unit: dBm).

Referring to the graphs 801 and 802, the PSD lowered after PIMC denotes that the PIM, in other words, a harmonic component, is removed from a corresponding frequency domain. In a specific frequency domain, the PSD in the case of using the signal that passed through the filter is lower than the PSD in the case of using the feedback signal that does not pass through the filter. As the PIM removal is performed based on the filter-feedback signal, an interference component may become closer to a noise level and communication performance may be improved.

Embodiments of the disclosure propose an electronic device and a method for obtaining a feedback signal, a filter-feedback signal, and a reverse signal together. The electronic device may include a communication circuit including a synthesis circuit and a separation circuit for obtaining the feedback signal, the filter-feedback signal, and the reverse signal together.

According to an embodiment, the communication circuit may include a directional combiner for extracting the feedback signal.

According to an embodiment, the communication circuit may include the directional combiner for extracting the filter-feedback signal.

According to an embodiment, the communication circuit may include a circulator for obtaining the reverse signal.

According to an embodiment, the communication circuit may include an attenuation circuit for reducing a magnitude of the reverse signal.

According to an embodiment, the communication circuit may include a combiner for synthesizing the feedback signal, the filter-feedback signal, and the reverse signal.

According to an embodiment, the communication circuit may extract the reverse signal from a composite signal.

According to an embodiment, the communication circuit may include a first compensation circuit for compensating a correlation delay between a DPD input signal and the feedback signal.

According to an embodiment, the communication circuit may include a first operator for calculating the magnitude and phase of the DPD input signal and the feedback signal.

According to an embodiment, the communication circuit may include a first multiplier for multiplying the DPD input signal by a result of the first operator. The first multiplier may compensate for the DPD input signal.

According to an embodiment, the communication circuit may include a first subtractor for removing the compensated DPD input signal from the composite signal.

According to an embodiment, the communication circuit may include a second compensation circuit for compensating for the correlation delay between the DPD input signal and the filter-feedback signal and a delay of the first subtractor.

According to an embodiment, the communication circuit may include a second operator for calculating the magnitude and phase of the delayed DPD input and filter-feedback signal.

According to an embodiment, the communication circuit may include a second multiplier for multiplying the delayed DPD input signal by a calculated result of the second operator.

According to an embodiment, the communication circuit may include a third compensation circuit for compensating for a delay of the second operator. The third compensation circuit may delay a result of the first subtractor by the delay of the second operator.

According to an embodiment, the communication circuit may include a second subtractor for removing an output of the second multiplier from an output of the third compensation circuit. An output of the second subtractor may correspond to the reverse signal.

According to an embodiment, the communication circuit may extract the feedback signal from the composite signal.

According to an embodiment, the communication circuit may include a fourth compensation circuit for extracting the feedback signal. The fourth compensation circuit may compensate for a delay for at least one of the correlation delay between the DPD input signal and the feedback signal, a delay of the second compensation circuit, and a delay of the subtractor. The composite signal may be inputted to the fourth compensation circuit. The fourth compensation circuit may compensate for the composite signal as much as a delay for the at least one.

According to an embodiment, a third subtractor for removing the output of the third compensation circuit from an output of the fourth compensation circuit may be included. An output of the third subtractor may correspond to the feedback signal.

According to an embodiment, the communication circuit may extract the filter-feedback signal from the composite signal.

According to an embodiment, the communication circuit may include a fifth compensation circuit for extracting the filter-feedback signal. The fifth compensation circuit may compensate for a delay of the second subtractor. An output signal of the third compensation circuit may be inputted to the fifth compensation circuit. The fifth compensation circuit may compensate for the output signal of the third compensation circuit as much as the delay of the second subtractor.

According to an embodiment, the communication circuit may include a fourth subtractor for removing the output of the second subtractor from an output of the fifth compensation circuit. An output of the fourth subtractor may correspond to the filter-feedback signal.

According to an embodiment, the first coupler may comprise a directional coupler on a line between a radio frequency (RF) source and a load. The first coupler may be further configured to provide RF power corresponding to a forward direction and power reflected from the load to the RF source. The first coupler may be disposed on a transmission path before the circulator and after an output terminal of the PA.

According to an embodiment, the separation circuit may be further configured to perform an operation for compensating a delay of circuits used to obtain the reverse signal.

Embodiments of the disclosure proposes a structure for simplifying the communication circuit by changing all signals to a digital domain through a path passing through one ADC. Through this, the number of ADC required may be reduced. The signal passing through the ADC may be separated into the feedback signal, the filter-feedback signal, and the reverse signal in the digital domain, respectively.

An electronic device according to embodiments may calculate a return loss (or VSWR) based on a digital signal of the feedback signal and a digital signal of the reverse signal. Without a switch, as the digital signal of the feedback signal and the digital signal of the reverse signal are supplied continuously in time domain, the return loss may be calculated in real time.

The electronic device according to embodiments may calculate a PIM component to be removed based on a digital signal of the filter-feedback signal. PIMC performance may be improved by removing an interference component of a transmitting end from a reception signal by using a signal after a filter end, in other words, the digital signal of the filter-feedback signal.

In embodiments of the disclosure, an electronic device may comprise a Digital Pre-Distortion (DPD), and a digital-to-analog converter (DAC). The electronic device may comprise a power amplifier (PA). The electronic device may comprise a first coupler for obtaining a feedback signal from an output of the power amplifier. The electronic device may comprise a circulator for obtaining a reverse signal in which the output of the power amplifier is reflected. The electronic device may comprise a transmission filter. The electronic device may comprise a second coupler for obtaining a filter-feedback signal from an output of the transmission filter. The electronic device may comprise an antenna. The electronic device may comprise an analog-to-digital converter (ADC) for converting a composite signal including the feedback signal, the filter-feedback signal, and the reverse signal into a digital composite signal. The electronic device may comprise a separation circuit. The electronic device may comprise a pulse inter-modulation cancellation (PIMC) circuit. The separation circuit may be configured to obtain, based on the digital composite signal and an input signal of the DPD, a digital signal of the feedback signal, a digital signal of the filter-feedback signal, and a digital signal of the reverse signal, respectively.

According to an embodiment, in order to respectively obtain the digital signal of the feedback signal, the digital signal of the filter-feedback signal, and the digital signal of the reverse signal, the separation circuit may be configured to generate an estimated feedback signal based on the input signal.

In order to respectively obtain the digital signal of the feedback signal, the digital signal of the filter-feedback signal, and the digital signal of the reverse signal, the separation circuit may be configured to generate an estimated filter-feedback signal based on the input signal. In order to respectively obtain the digital signal of the feedback signal, the digital signal of the filter-feedback signal, and the digital signal of the reverse signal, the separation circuit may be configured to obtain a digital signal of the reverse signal by removing the estimated feedback signal and the estimated filter-feedback signal from the digital composite signal.

According to an embodiment, the estimated feedback signal may be generated based on the input signal of the DPD, a magnitude of the feedback signal, and a delay of the feedback signal. The estimated filter-feedback signal may be generated based on the input signal of the DPD, a magnitude of the filter-feedback signal, and a delay of the filter-feedback signal.

According to an embodiment, in order to obtain the digital signal of the reverse signal, the separation circuit may be configured to obtain a reference signal by removing the estimated feedback signal from the digital composite signal. In order to obtain the digital signal of the reverse signal, the separation circuit may be configured to obtain the digital signal of the reverse signal by removing the estimated filter-feedback signal from the reference signal.

According to an embodiment, in order to obtain the reference signal, the separation circuit may be configured to subtract the estimated feedback signal from the digital composite signal. In order to obtain the reference signal, the separation circuit may be configured to obtain the reference signal by compensating a delay for the reverse signal to a result of the subtraction.

According to an embodiment, in order to respectively obtain the digital signal of the feedback signal, the digital signal of the filter-feedback signal, and the digital signal of the reverse signal, the separation circuit may be configured to obtain the digital signal of the feedback signal by removing the reference signal from the digital composite signal.

According to an embodiment, in order to obtain the digital signal of the feedback signal, the separation circuit may be configured to obtain a compensation signal by compensating the digital composite signal for a delay for the reference signal. In order to obtain the digital signal of the feedback signal, the separation circuit may be configured to obtain the digital signal of the feedback signal by removing the reference signal from the compensation signal.

According to an embodiment, in order to respectively obtain the digital signal of the feedback signal, the digital signal of the filter-feedback signal, and the digital signal of the reverse signal, the separation circuit may be configured to obtain the digital signal of the filter-feedback signal, by removing the digital signal of the reverse signal from the reference signal after obtaining the digital signal of the reverse signal.

According to an embodiment, the electronic device may further comprise a processor. The processor may be additionally configured to obtain a return loss based on the reverse signal and the feedback signal.

According to an embodiment, the electronic device may further comprise a reception filter for obtaining a reception signal through the antenna. The electronic device may further comprise a reception ADC for converting the reception signal into a digital reception signal. The PIMC circuit may be configured to remove a passive intermodulation (PIM) of the digital reception signal based on the digital reception signal and the filter-feedback signal.

In embodiments of the disclosure, a method performed by an electronic device, may comprise obtaining a feedback signal from an output of a power amplifier (PA). The method may comprise obtaining a reverse signal in which the output of the power amplifier is reflected. The method may comprise obtaining a filter-feedback signal from an output of a transmission filter. The method may comprise converting a composite signal including the feedback signal, the filter-feedback signal, and the reverse signal into a digital composite signal through an analog-to-digital converter (ADC). The method may comprise obtaining, based on the digital composite signal and a digital pre-distortion (DPD) input signal, a digital signal of the feedback signal, a digital signal of the filter-feedback signal, and a digital signal of the reverse signal, respectively.

According to an embodiment, an operation of obtaining respectively the digital signal of the feedback signal, the digital signal of the filter-feedback signal, and the digital signal of the reverse signal may comprise generating an estimated feedback signal based on the input signal. An operation of obtaining respectively the digital signal of the feedback signal, the digital signal of the filter-feedback signal, and the digital signal of the reverse signal may comprise generating an estimated filter-feedback signal based on the input signal. An operation of obtaining respectively the digital signal of the feedback signal, the digital signal of the filter-feedback signal, and the digital signal of the reverse signal may comprise obtaining a digital signal of the reverse signal by removing the estimated feedback signal and the estimated filter-feedback signal from the digital composite signal.

According to an embodiment, the estimated feedback signal may be generated based on the input signal of the DPD, a magnitude of the feedback signal, and a delay of the feedback signal. The estimated filter-feedback signal may be generated based on the input signal of the DPD, a magnitude of the filter-feedback signal, and a delay of the filter-feedback signal.

According to an embodiment, an operation of obtaining the digital signal of the reverse signal may comprise obtaining a reference signal by removing the estimated feedback signal from the digital composite signal. An operation of obtaining the digital signal of the reverse signal may comprise obtaining the digital signal of the reverse signal by removing the estimated filter-feedback signal from the reference signal.

According to an embodiment, an operation of obtaining the reference signal, may comprise subtracting the estimated feedback signal from the digital composite signal. An operation of obtaining the reference signal, may comprise obtaining the reference signal by compensating a delay for the reverse signal to a result of the subtraction.

According to an embodiment, the operation of obtaining respectively the digital signal of the feedback signal, the digital signal of the filter-feedback signal, and the digital signal of the reverse signal, may comprise obtaining the digital signal of the feedback signal by removing the reference signal from the digital composite signal.

According to an embodiment, an operation of obtaining the digital signal of the feedback signal, may comprise obtaining a compensation signal by compensating the digital composite signal for a delay for the reference signal. An operation of obtaining the digital signal of the feedback signal, may comprise obtaining the digital signal of the feedback signal by removing the reference signal from the compensation signal.

According to an embodiment, the operation of obtaining respectively the digital signal of the feedback signal, the digital signal of the filter-feedback signal, and the digital signal of the reverse signal, may comprise obtaining the digital signal of the filter-feedback signal, by removing the digital signal of the reverse signal from the reference signal after obtaining the digital signal of the reverse signal.

According to an embodiment, the electronic device may further comprise obtaining a return loss based on the reverse signal and the feedback signal.

According to an embodiment, the method may further comprise obtaining a reception signal through the antenna. The method may further comprise converting the reception signal into a digital reception signal through a reception ADC. The method may further comprise removing a passive intermodulation (PIM) of the digital reception signal based on the digital reception signal and the filter-feedback signal.

According to an embodiment, magnitude compensation value and a delay compensation value may be obtained based on a magnitude and a delay value of the feedback signal. The estimated feedback signal may be generated by applying the magnitude compensation value and the delay compensation value to the input signal of the DPD.

Methods according to the embodiments described in the claims or the specification of the disclosure may be implemented in the form of hardware, software, or a combination of hardware and software.

When implemented as software, a computer-readable storage medium storing one or more programs (software module) may be provided. The one or more programs stored in the computer-readable storage medium is configured for execution by one or more processor in the electronic device. The one or more programs include instructions that cause the electronic device to execute methods according to embodiments described in the claim or the specification of the disclosure.

Such one or more programs (software modules, software) may be stored in random access memory, non-volatile memory including flash memory, read only memory (ROM), electrically erasable programmable read only memory (EE-PROM), magnetic disc storage device, compact disc-ROM (CD-ROM), digital versatile disc (DVD) or other form of optical storage, magnetic cassette. Alternatively, it may be stored in a memory configured with some or all combinations thereof. In addition, each configuration memory may be included a plurality.

In addition, the program may be stored in an attachable storage device that may be accessed through a communication network, such as the Internet, Intranet, local area network (LAN), wide area network (WAN), or storage area network (SAN), or a combination thereof. Such a storage device may be connected to a device performing an embodiment of the disclosure through an external port. In addition, a separate storage device on the communication network may access a device performing an embodiment of the disclosure.

In the above-described specific embodiments of the disclosure, the component included in the disclosure is expressed in singular or plural according to the presented specific embodiment. However, singular or plural expression is chosen appropriately for the situation presented for convenience of explanation, and the disclosure is not limited to singular or plural component, and even if the component is expressed in plural, it may be configured with singular, or even if it is expressed in singular, it may be configured with plural.

Meanwhile, in the detailed description of the present disclosure, the specific embodiment have been described, but it goes without saying that various modification is possible within the limit not departing from the scope of the present disclosure.

What is claimed is:

1. An electronic device comprising:
a digital pre-distortion (DPD);
a digital-to-analog converter (DAC);
a power amplifier (PA);
a first coupler configured to obtain a feedback signal from an output of the PA;
a circulator configured to obtain a reverse signal in which the output of the PA is reflected;
a transmission filter connected to the PA through the first coupler and the circulator;
a second coupler configured to obtain a filter-feedback signal from an output of the transmission filter;
an analog-to-digital converter (ADC) configured to convert a composite signal including the feedback signal, the filter-feedback signal, and the reverse signal into a digital composite signal; and
separation circuitry,
wherein the separation circuitry is configured to, based on the digital composite signal and an input signal of the DPD, obtain a digital signal of the feedback signal, a digital signal of the filter-feedback signal, and a digital signal of the reverse signal.

2. The electronic device of claim 1, wherein, in order to obtain the digital signal of the feedback signal, the digital signal of the filter-feedback signal, and the digital signal of the reverse signal, the separation circuitry is configured to:
based on the input signal of the DPD, generate an estimated feedback signal and an estimated filter-feedback signal; and
obtain the digital signal of the reverse signal by removing the estimated feedback signal and the estimated filter-feedback signal from the digital composite signal.

3. The electronic device of claim 2,
wherein the estimated feedback signal is generated based on the input signal of the DPD, a magnitude of the feedback signal, and a delay of the feedback signal, and
wherein the estimated filter-feedback signal is generated based on the input signal of the DPD, a magnitude of the filter-feedback signal, and a delay of the filter-feedback signal.

4. The electronic device of claim 2, wherein, in order to obtain the digital signal of the reverse signal, the separation circuitry is configured to:
obtain a reference signal by removing the estimated feedback signal from the digital composite signal; and
obtain the digital signal of the reverse signal by removing the estimated filter-feedback signal from the reference signal.

5. The electronic device of claim 4, wherein, in order to obtain the reference signal, the separation circuitry is configured to:
subtract the estimated feedback signal from the digital composite signal; and
obtain the reference signal by compensating a delay for the reverse signal to a result of the subtraction.

6. The electronic device of claim 4, wherein, in order to obtain the digital signal of the feedback signal, the digital signal of the filter-feedback signal, and the digital signal of the reverse signal, the separation circuitry is configured to obtain the digital signal of the feedback signal by removing the reference signal from the digital composite signal.

7. The electronic device of claim 4, wherein, in order to obtain the digital signal of the feedback signal, the separation circuitry is configured to:
obtain a compensation signal by compensating the digital composite signal for a delay for the reference signal; and
obtain the digital signal of the feedback signal by removing the reference signal from the compensation signal.

8. The electronic device of claim 4, wherein, in order to obtain the digital signal of the feedback signal, the digital signal of the filter-feedback signal, and the digital signal of the reverse signal, the separation circuitry is configured to obtain the digital signal of the filter-feedback signal by removing the digital signal of the reverse signal from the reference signal after obtaining the digital signal of the reverse signal.

9. The electronic device of claim 1, further comprising:
a processor,
wherein the processor is configured to, based on the reverse signal and the feedback signal, obtain a return loss.

10. The electronic device of claim 1, further comprising:
a reception filter configured to obtain a reception signal through an antenna;
a reception ADC configured to convert the reception signal into a digital reception signal; and
a pulse inter-modulation cancellation (PIMC) circuitry,
wherein the PIMC circuitry is configured to, based on the digital reception signal and the filter-feedback signal, remove a passive intermodulation (PIM) of the digital reception signal.

11. The electronic device of claim 1,
wherein the first coupler comprises a directional coupler on a line between a radio frequency (RF) source and a load,
wherein the first coupler is further configured to provide RF power corresponding to a forward direction and power reflected from the load to the RF source, and
wherein the first coupler is disposed on a transmission path before the circulator and after an output terminal of the PA.

12. The electronic device of claim 1, wherein the separation circuitry is further configured to perform an operation for compensating a delay of circuitry used to obtain the reverse signal on a reference signal.

13. A method performed by an electronic device, the method comprising:
obtaining a feedback signal from an output of a power amplifier (PA);
obtaining a reverse signal in which the output of the PA is reflected, and obtaining a filter-feedback signal from an output of a transmission filter;
converting a composite signal including the feedback signal, the filter-feedback signal, and the reverse signal into a digital composite signal through an analog-to-digital converter (ADC); and
based on the digital composite signal and an input signal of a digital pre-distortion (DPD), obtaining a digital signal of the feedback signal, a digital signal of the filter-feedback signal, and a digital signal of the reverse signal.

14. The method of claim 13, wherein an operation of obtaining the digital signal of the feedback signal, the digital signal of the filter-feedback signal, and the digital signal of the reverse signal, comprises:
based on the input signal of the DPD, generating an estimated feedback signal and an estimated filter-feedback signal; and
obtaining the digital signal of the reverse signal by removing the estimated feedback signal and the estimated filter-feedback signal from the digital composite signal.

15. The method of claim 14,
wherein the estimated feedback signal is generated based on the input signal of the DPD, a magnitude of the feedback signal, and a delay of the feedback signal, and
wherein the estimated filter-feedback signal is generated based on the input signal, a magnitude of the filter-feedback signal, and a delay of the filter-feedback signal.

16. The method of claim 14, wherein an operation of obtaining the digital signal of the reverse signal comprises:
obtaining a reference signal by removing the estimated feedback signal from the digital composite signal; and
obtaining the digital signal of the reverse signal by removing the estimated filter-feedback signal from the reference signal.

17. The method of claim 16, wherein an operation of obtaining the reference signal comprises:
subtracting the estimated feedback signal from the digital composite signal; and
obtaining the reference signal by compensating a delay for the reverse signal to a result of the subtraction.

18. The method of claim 16, wherein the operation of obtaining the digital signal of the feedback signal, the digital signal of the filter-feedback signal, and the digital signal of the reverse signal, further comprises:
obtaining the digital signal of the feedback signal by removing the reference signal from the digital composite signal.

19. The method of claim 16, wherein an operation of obtaining the digital signal of the feedback signal comprises:
obtaining a compensation signal by compensating the digital composite signal for a delay for the reference signal; and
obtaining the digital signal of the feedback signal by removing the reference signal from the compensation signal.

20. The method of claim 16, wherein the operation of obtaining the digital signal of the feedback signal, the digital signal of the filter-feedback signal, and the digital signal of the reverse signal, further comprises:

obtaining the digital signal of the filter-feedback signal by removing the digital signal of the reverse signal from the reference signal after obtaining the digital signal of the reverse signal.

* * * * *